United States Patent
Sheth et al.

(10) Patent No.: US 12,094,528 B2
(45) Date of Patent: Sep. 17, 2024

(54) MEMORY WITH DOUBLE REDUNDANCY

(71) Applicant: QUALCOMM Incorporated, San Diego, CA (US)

(72) Inventors: Dhvani Sheth, San Diego, CA (US); Hochul Lee, Los Angeles, CA (US); Anil Chowdary Kota, San Diego, CA (US); Chulmin Jung, San Diego, CA (US)

(73) Assignee: QUALCOMM INCORPORATED, San Diego, CA (US)

(*) Notice: Subject to any disclaimer, the term of this patent is extended or adjusted under 35 U.S.C. 154(b) by 276 days.

(21) Appl. No.: 17/833,852

(22) Filed: Jun. 6, 2022

(65) Prior Publication Data
US 2023/0395139 A1   Dec. 7, 2023

(51) Int. Cl.
*G11C 29/14* (2006.01)
*G11C 11/418* (2006.01)
*G11C 11/419* (2006.01)

(52) U.S. Cl.
CPC .......... *G11C 11/419* (2013.01); *G11C 11/418* (2013.01)

(58) Field of Classification Search
CPC ............................ G11C 29/4401; G11C 29/14
See application file for complete search history.

(56) References Cited

U.S. PATENT DOCUMENTS

| 6,037,799 A | 3/2000 | McClure |
| 7,064,990 B1 | 6/2006 | Dawson et al. |
| 2010/0020609 A1 | 1/2010 | Han et al. |
| 2014/0119131 A1* | 5/2014 | Verma ................ G11C 29/4401 365/189.02 |

FOREIGN PATENT DOCUMENTS

EP        1163584 A1    12/2001

OTHER PUBLICATIONS

International Search Report and Written Opinion—PCT/US2023/019667—ISA/EPO—Jul. 1, 2023.
Li J-F., et al., "A Built-In Self-Repair Scheme for Semiconductor Memories with 2-D Redundancy", International Test Conference, 2003, Proceedings ITC 2003, Jan. 2003, pp. 393-402.

* cited by examiner

*Primary Examiner* — Jason Lappas
(74) *Attorney, Agent, or Firm* — Haynes and Boone, LLP

(57) ABSTRACT

A memory is provided with a plurality of column groups and two redundant column groups. If there are two defective columns in the plurality of column groups, the plurality of column groups may be divided into a no-shift region, a one-shift region, and a two-shift region. The memory includes a plurality of input/output circuits corresponding to the plurality of column groups. Each input/output circuit may provide a data input signal during a write operation and receive a data output signal during a read operation. Each input/output circuit also includes a switch matrix. In the no-shift region, the switch matrix couples the input/output circuit to a core in the corresponding column group. In the one-shift region, the switch matrix couples the input/output circuit to a core in a subsequent column group. In the two-shift region, the switch matrix couples the input/output circuit to a core in a next-to-subsequent column group.

15 Claims, 9 Drawing Sheets

| Mode | ith cut signal | (i+1)th redundancy shift signal | (i+1)th double redundancy shift signal | (i-1)th cut signal | ith redundancy shift signal | ith double redundancy shift signal | ith double redundancy shift cut signal |
|---|---|---|---|---|---|---|---|
| no shift | 0 | 0 | 0 | 0 | 0 | 0 | 0 |
| single shift (the ith column is the first defective column) | 1 | 0 | 0 | 0 | 1a on, 1b off | 2a off | 2b on |
| single shift (the ith column is subsequent to the first defective column) | 0 | 1 | 0 | 0 | 1a off, 1b on | 2a off | 2b on |
| single shift (the ith column is subsequent to the first defective column) | 1 | 1 | 0 | 0 | 1a off, 1b on | 2a off | 2b on |
| double shift (the ith column is the second defective column) | 1 | 1 | 1 | 0 | 1a off, 1b on | 2a on | 1 2b off |
| double shift (the ith column is subsequent to the 2nd defective column) | 0 | 1 | 0 | 1 | 1a off, 1b on | 2a on | 1 2b off |
| double shift (the ith column precedes the 2nd defective column) | 0 | 1 | 0 | 0 | 1a off, 1b on | 2a off | 1 2b off |

FIG. 4A

MEMORY WITH DOUBLE REDUNDANCY

TECHNICAL FIELD

This application relates to memories, and more particularly to a memory bank that may replace a pair of defective column groups with two redundant column groups.

BACKGROUND

A static random-access memory (SRAM) includes an array of bitcells arranged into rows and columns. To enhance performance such as by lowering the bit line capacitance, the array of bitcells is typically subdivided into banks. Without redundancy, a single error to a bank may render the entire bank inoperative. It is thus conventional for each bank to have a redundant column so that the bank may replace a defective column with the redundant column.

There are two main ways to implement column redundancy: Input/Output (I/O) shifting and sense amplifier shifting. I/O shifting is simpler to implement but requires more semiconductor die space as compared to sense amplifier shifting. In both types of column redundancy, each bank may replace a defective column through the use of a redundant column. A bank may thus replace a single defective column using the redundant column. But defects to two columns in a single bank may render the bank inoperative.

SUMMARY

In accordance with an aspect of the disclosure, a memory is provided that includes: a plurality of column groups, each column group in the plurality of column groups including a plurality of multiplexed columns, the plurality of column groups including a first column group, a second column group that is adjacent to the first column group, and a third column group that is adjacent to the second column group; and a first switch matrix configured to couple a latch to one of the first column group, the second column group, and the third column group responsive to a plurality of column redundancy signals.

In accordance with another aspect of the disclosure, a memory is provided that includes: a plurality of columns groups, each column group in the plurality of column groups including a plurality of multiplexed columns, the plurality of column groups including a first column group and a second column group adjacent to the first column group; a first latch; a second latch; and a first switch matrix including: a first switch coupled between the first column group and a first center node, a second switch coupled between the first center node and the second column group, a third switch coupled between the first latch and the first center node, and a fourth switch coupled between the first center node and the second latch.

In accordance with yet another aspect of the disclosure, a memory is provided that includes: a plurality of column groups, each column group in the plurality of column groups including a plurality of multiplexed columns, the plurality of column groups including a first column group and a second column group; a first latch; a second latch; a first switch matrix coupled to the first column group, the second column group, the first latch, and the second latch; a first redundant column group including a first plurality of multiplexed redundant columns; and a second redundant column group including a second plurality of multiplexed redundant columns.

In accordance with yet another aspect of the disclosure, a method of memory redundancy is provided that includes: coupling a first latch to a first column group in a plurality of column groups responsive to a subset of the plurality of column groups that extends from an initial column group to the first column group having no defective column groups; coupling the first latch to a second column group in the plurality of column groups responsive to the first column group being a first defective column group in the plurality of column groups, wherein the second column group is adjacent to the first column group; and coupling the first latch to a third column group in the plurality of column groups responsive to the second column group being a second defective column group in the plurality of column groups, wherein the third column group is adjacent to the second column group.

These and additional advantages may be better appreciated through the following detailed description.

BRIEF DESCRIPTION OF THE DRAWINGS

FIG. 4A is a truth table implemented by a decoder in accordance with an aspect of the disclosure.

Implementations of the present disclosure and their advantages are best understood by referring to the detailed description that follows. It should be appreciated that like reference numerals are used to identify like elements illustrated in one or more of the figures.

DETAILED DESCRIPTION

Figure 1:
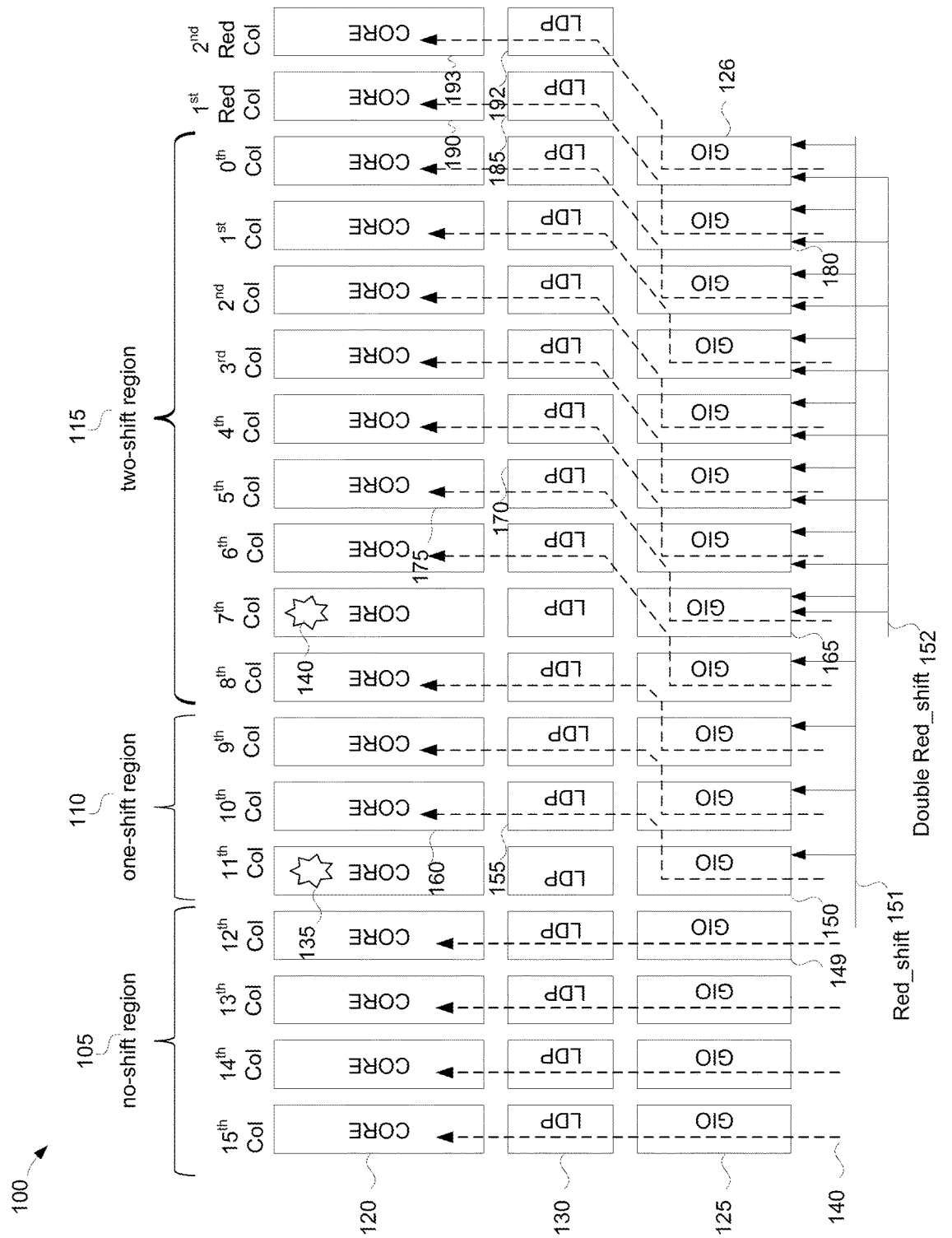
FIG. 1 illustrates a memory bank having a double redundancy shift in accordance with an aspect of the disclosure.

An I/O shifting redundancy scheme is provided that may replace two defective column groups in a single bank. To provide this advantageous double redundancy, a memory is disclosed that includes a plurality of column groups and a pair of redundant column groups. To provide a better appreciation of these innovative features, some terminology will first be reviewed. In an SRAM bank, each bitcell stores a bit signal and a complement of the bit signal. To access these complementary signals, a bitcell couples to a pair of bit lines. An SRAM bank includes a plurality of such bit line pairs, each bit line pair coupling to a single column of bitcells arranged in rows in the single column according to corresponding word lines. During a write operation, an input latch in an input/output circuit (which is also denoted as an I/O circuit herein) couples to a selected bitcell through the corresponding bit line pair. Similarly, during a read operation, an output latch in the input/output circuit couples to a selected bitcell through the corresponding bit line pair.

This coupling between a bit line pair (and the corresponding bitcell) and an input/output circuit may be multiplexed such that the input/output circuit may couple to one of a multiplexed plurality of columns. For example, in a "MUX2" implementation, the bit line pairs may be organized into odd and even pairs. Depending upon the multiplexing, an input/output circuit may then couple to a selected bit line pair from a corresponding odd and even pair. In a write operation, the input/output circuit may then couple through a write driver and a write multiplexer to the selected bit line pair. Similarly, during a read operation, the input/output circuit may couple through a read multiplexer and a sense amplifier to the selected bit line pair. Other types of multiplexing of bit line pairs may be used such as in a "MUX4" implementation in which each input/output circuit may couple to one of four multiplexed columns.

With regard to the column multiplexing, a combination of the write driver, the write multiplexer, the read multiplexer, and the sense amplifier may be denoted herein as a "local data path." A combination of local data path and the corresponding multiplexed columns is denoted herein as a "column group" to emphasize the bit line multiplexing aspect. Each multiplexed column includes a bit line pair and a plurality of bitcells.

The following discussion will be directed to implementations in which the I/O circuit is a global I/O circuit, but it will be appreciated that the I/O shifting disclosed herein is applicable to implementations in which the I/O circuits are local I/O circuits. The term "global" I/O circuit is used in that a global I/O circuit may be shared between two banks whereas a local I/O circuit pertains to only one bank. In the following discussion, each global I/O circuit will be referred to as simply an "I/O circuit" for brevity.

To address the possibility of two defective column groups in a single bank, a memory bank is disclosed that includes two redundant column groups. If there are no defective column groups in the memory bank, a switch matrix in each I/O circuit is configured to couple a latch in the I/O circuit to a corresponding default column group. During a read operation, an output latch in the I/O circuit then receives a retrieved data bit from the default column group. Similarly, an input latch in the I/O circuit provides a data bit to be written to the default column group during a write operation. Should the memory bank include a single defective column group, one or more of the I/O circuits may instead each couple to a neighboring column group. For example, suppose that there are N column groups in a bank, arranged from an (N−1)th column group to a zeroth column group, where N is a positive plural integer. There would then be N I/O circuits: an (N−1)th I/O circuit corresponding to the (N−1)th column group, an (N−2)th I/O circuit corresponding to the (N−2)th column group and so on to a zeroth I/O circuit corresponding to the zeroth column group. Without any errors, each I/O circuit couples to the corresponding column group. But suppose that an ith column group is a first defective column group in the bank, where i is an integer that is less than N. From the Nth column group to the (i+1)th column group, each I/O circuit continues to couple to its default column group as discussed previously. From the ith column group to the zeroth column group, each global I/O circuit instead couples to a neighboring or adjacent column group to the default column group. For example, the ith global I/O circuit couples to the (i−1)th column group, the (i−1)th I/O circuit couples to the (i−2)th column group, and so on such that the zeroth I/O circuit couples to a first redundant column group. In the case of such a single defective column group, the array of column groups may thus be divided into a no-shift region in which each I/O circuit couples to the default column group and into a one-shift region in which each I/O circuit couples to a consecutive or neighboring column group to the default column group.

Should there be two defective column groups in a single bank, the plurality of column groups may instead be divided into a no-shift region, a one-shift region, and a two-shift region. The no-shift region and the one-shift region are as discussed earlier and are demarcated by an initial defective column group. A preceding column group to a second defective column group is an initial column group in the two-shift region. Each I/O circuit in the two-shift region couples to a next-to-neighboring column group to the I/O circuit's default column group. For example, suppose that the initial defective column group is the ith column group as discussed previously. The second defective column group may then be designated as a jth column group, where j is an integer that less than i and greater than or equal to zero. A (j+1)th column group would then separate the one-shift region from the two-shift region. In such a case, the (j+1)th I/O circuit would couple to the (j−1)th column group, the jth I/O circuit would couple to the (j−2)th column group, and so on such that a first I/O circuit would couple to the first redundant column group and a zeroth I/O circuit would couple to the second redundant column group.

In a given bank, the entire plurality of column groups forms a no-shift region if there are no defective column groups. In such a case, there is no one-shift region nor is there a two-shift region. If there is only one defective column group, the plurality of column groups is divided into a no-shift region and a one-shift region, there being no two-shift region. If there are two (non-consecutive) defective column groups, the plurality of column groups is divided into a no-shift region, a one-shift region, and a two-shift region. A memory with two consecutive defective column groups may be divided into a no-shift region and a two-shift region (there being no one-shift region).

To identify the defective column groups, the memory may be tested such as at manufacture. The memory may be an embedded memory in a system such as a system on a chip (SoC). The address of the defective column groups may then be stored in a read-only memory in the SoC such as an array of fuses. During normal operation of the SoC, a column group in the plurality of column groups in the memory is addressed for a read or write operation. There are then three possibilities: 1) the addressed column group is in a no-shift region, 2) the addressed column group is in a one-shift region, and 3) the addressed column group is a two-shift region. To determine which of these three possibilities exists for the addressed column group, each I/O circuit includes a redundancy decoder. For brevity, each redundancy decoder will simply be denoted as a decoder in the following discussion.

An example memory bank 100 with this advantageous double redundancy is shown in FIG. 1. Memory bank 100 includes sixteen column groups arranged from a fifteenth column group to a zeroth column group. Each column group includes a core that includes bit line pair(s) and bitcells (not illustrated). Since there are sixteen column groups, there are also sixteen I/O circuits arranged from a fifteenth I/O circuit 125 to a zeroth I/O circuit 126. In a no-shift state, the sixteen I/O circuits couple on a one-to-one basis with a default one of the sixteen column groups. For example, the fifteenth I/O circuit 125 couples to the fifteenth column group whereas the zeroth I/O circuit couples 126 to the zeroth column group. Each I/O circuit couples to a column group's core through a local data path (LDP). For example, the fifteenth I/O circuit 125 may couple through a LDP 130 of the fifteenth column group to a core 120. Each column group's local data path may include write multiplexers and read multiplexers (not illustrated) as will be explained further herein.

In memory bank 100 the $11^{th}$ column group has a first defect 135. The $11^{th}$ column group is thus the first defective column group in memory bank 100. As will be explained further herein, each I/O circuit from the $11^{th}$ column group through the zeroth column group will thus be in either a one-shift region 110 or a two-shift region 115. The $15^{th}$ column group through the $12^{th}$ column group are in a no-shift region 105. Should the 11th column group be the only defective column group in memory bank 100, the one-shift region 110 would extend from the $11^{th}$ column group to the zeroth column group. But memory bank 100 has a second defect 140 in the $7^{th}$ column. The $7^{th}$ column group is thus a second defective column group in memory bank 100. One-shift region 110 thus ends at the $9^{th}$ column group. Two-shift region 115 extends from the $8^{th}$ column group to the zeroth column group.

In no-shift region 105, each I/O circuit couples to the local data path and core in the I/O circuit's default column group. For example, fifteenth I/O circuit 125 thus couples through local data path 130 in the $15^{th}$ column group to the $15^{th}$ column group's core 120. The coupling for each I/O circuit is represented by an arrow 140. As implied by the designation of "one-shift," each I/O circuit in one-shift region 110 does not couple to its default column group but instead couples through the local data path in the neighboring column group to its default column group. For example, an $11^{th}$ I/O circuit 150 couples through a local data path 155 in the $10^{th}$ column group to the $10^{th}$ column group's core 160. Similarly, each I/O circuit in two-shift region 115 couples through the local data path in the next-to-neighboring column group to the I/O circuit's default column group. For example, a seventh I/O circuit 165 in two-shift region 115 couples through the local data path 170 in the $5^{th}$ column group to the $5^{th}$ column group's core 175.

Due to the double shifting in two-shift region 115, an I/O circuit 180 in the $1^{st}$ column group couples through a local data path 185 in a first redundant column group ($1^{st}$ Red Col) to a core 190 in the first redundant column group. Similarly, the zeroth I/O circuit 126 couples through a local data path 192 in a second redundant column group ($2^{nd}$ Red Col) to a core 193 in the second redundant column group.

To enable the no shift, one shift, and two shift behavior, each I/O circuit includes a switch matrix (not illustrated in FIG. 1) that is controlled by a plurality of redundancy shift signals. In particular, each switch matrix is controlled by a corresponding redundancy shift signal and a double redundancy shift signal. For illustration clarity, a single redundancy shift (red_shift) signal 151 is shown in FIG. 1 but in reality there would be sixteen different redundancy shift signals, one for each I/O circuit. Similarly, a single double redundancy shift (double red_shift) signal 152 is shown in FIG. 1 for illustration clarity whereas in reality there would be sixteen different double redundancy shift signals, one for each I/O circuit. Each I/O circuit thus receives a corresponding redundancy shift signal 151 and a double redundancy shift signal 152. For additional illustration clarity, this receipt by the I/O circuits of the redundancy shift signal 151 is shown in FIG. 1 only for the I/O circuits for which the redundancy shift signal 151 is true. Thus, only the I/O circuits in the one-shift region 110 and in the two-shift region 115 are shown receiving the redundancy shift signal 151. The redundancy shift signal 151 is false for each I/O circuit the no-shift region 105. For additional illustration clarity, the receipt by the I/O circuits of the double redundancy shift signal 152 is shown in FIG. 1 only for the I/O circuits for which the double redundancy shift signal 152 is true. The double redundancy shift signal 152 is true for each I/O circuit in the two-shift region 115 except for the initial column group in the two-shift region 115 (this is the $8^{th}$ column group in memory bank 100) and is false for each I/O circuit in the no-shift region 105 and in the one-shift region 110.

The I/O circuit arrangement of the I/O circuits from the $15^{th}$ I/O circuit 125 to the zeroth I/O circuit 126 provides a basis for what is denoted herein as a "preceding" I/O circuit and as a "subsequent" I/O circuit. Excluding the fifteenth I/O circuit 125, each I/O circuit has a preceding I/O circuit in the I/O circuit arrangement. For example, a twelfth I/O circuit 149 is the preceding I/O circuit to the eleventh I/O circuit 150. More generally, an ith I/O circuit is the preceding I/O circuit to an (i–1)th I/O circuit, where i is a positive integer. Excluding the zeroth I/O circuit 126, each I/O circuit has a subsequent I/O circuit in the I/O circuit arrangement. For example, the $11^{th}$ I/O circuit 150 is the subsequent I/O circuit to the twelfth I/O circuit 149. More generally, an (i–1)th I/O circuit is the subsequent I/O circuit to an ith I/O circuit, where i is again a positive integer. Note that this arrangement is arbitrary and may be reversed in alternative implementations in which the two redundant column groups would be adjacent the 15th column group as opposed to being adjacent to the zeroth column group. In such an alternative implementation, the zeroth column would be the initial column and the $15^{th}$ column would be the final column.

This definition of a preceding I/O circuit and a subsequent I/O circuit in turn provides a basis for a definition of what is denoted herein as "feedback" signals and "feedforward" signals. A feedback signal propagates from a given I/O circuit to the preceding I/O circuit. Conversely, a feedforward signal propagates from a given I/O circuit to the subsequent I/O circuit.

Figure 2:
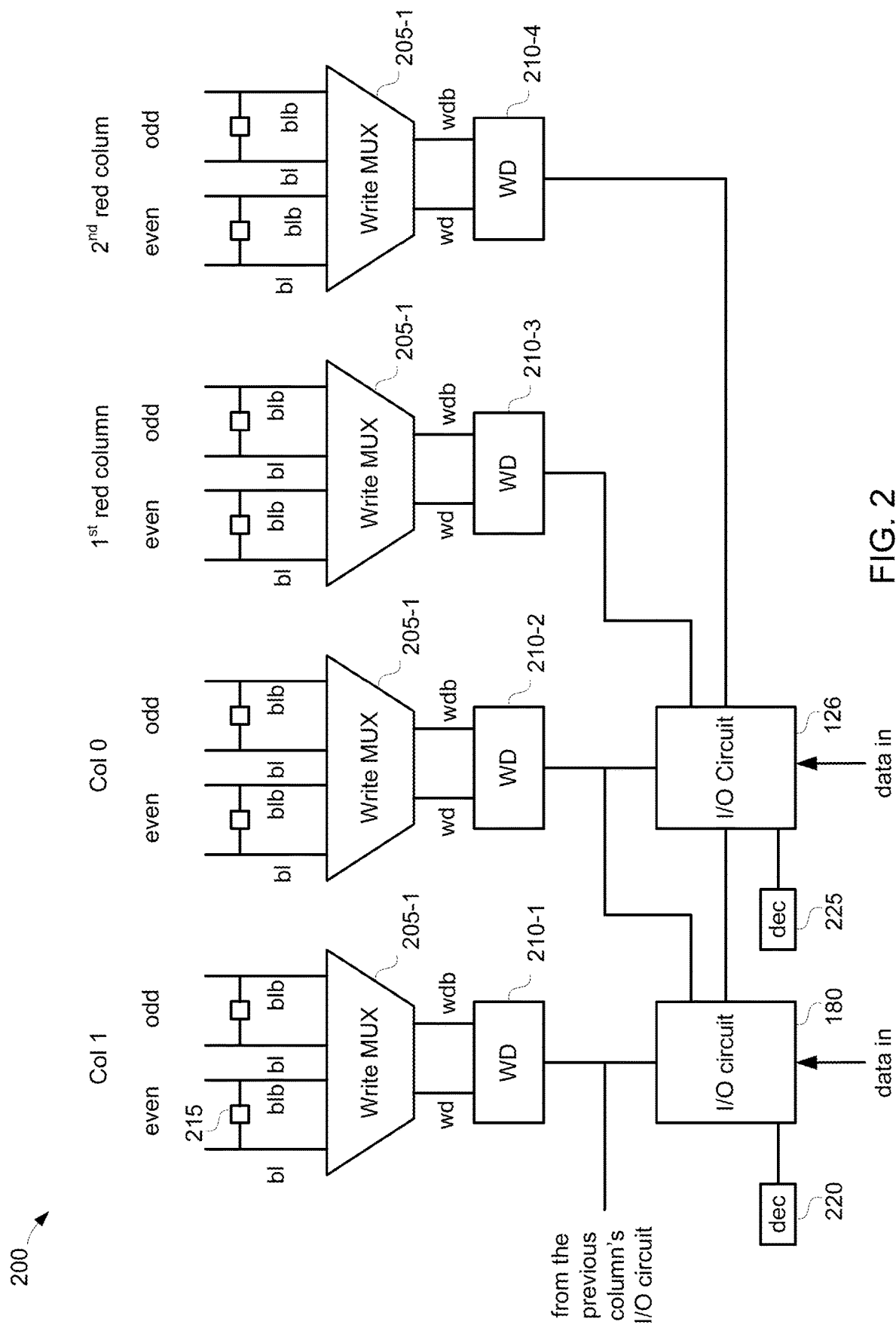
FIG. 2 illustrates a portion of the memory bank of FIG. 1 including the local data paths and the I/O circuits in accordance with an aspect of the disclosure.

As noted earlier, the term "column group" encompasses the local data path and the associated core of multiplexed bit line pair(s) and bitcells. For example, in a "MUX 2" implementation of memory array 100, each of the column groups includes both an even bit line pair and an odd bit line pair. Depending upon the column addressing, each I/O circuit then couples to either an even bit line pair or an odd bit line pair in such an implementation. More generally, each column group may include a plurality of multiplexed bit line pairs that depends upon the dimension or magnitude of the column multiplexing. A portion 200 of a MUX 2 implementation of memory bank 100 is shown in FIG. 2. For illustration clarity, portion 200 only includes the $1^{st}$ column group (Col 1), the zeroth column group (Col 0), the first redundant column group ($1^{st}$ red column) and the second redundant column group ($2^{nd}$ red column). An I/O circuit 180 is the default I/O circuit for the first column group. Similarly, the zeroth I/O circuit 126 is the default I/O circuit for the zeroth column group. Each of the first column group, the zeroth column group, the first redundant column group, and the second redundant column group includes both an even bit line pair and an odd bit line pair. Each even bit line pair and odd bit line pair is formed by a bit line bl and a complement bit line blb. Each bit line pair couples to a plurality of bitcells arranged into rows. For illustration clarity, only one bitcell is shown for each bit line pair. For example, the even bit line pair in the first column group couples to a bitcell 215. The bit line pairs and bitcells for each column group forms the column group's core 120 (FIG. 1). For illustration clarity, the local data path in each column group is represented only by a write multiplexer and a write driver (WD) but it will be appreciated that a corresponding read multiplexer and sense amplifier would also be included in such a MUX 2 implementation. The first column group thus includes a write driver 210-1 and a write multiplexer 205-1, the zeroth column group includes a write driver 210-2 and a write multiplexer 205-2, the first redundant column group includes a write driver 210-3 and a write multiplexer 205-3, and the second redundant column group includes a write driver 210-4 and a write multiplexer 205-4. Depending upon a data input signal during a write operation, each write driver controls the binary state (true or false) of a write driver (wd) signal and a complement write driver (wdb) signal to the corresponding write multiplexer. Depending upon whether the even or odd bit line pair is selected, each write multiplexer then drives the appropriate bit line pair accordingly.

If there are no errors in such an implementation, then the first column group and the second column group would be in a no-shift region. In that case, I/O circuit 180 responds to its data in signal during a write operation to couple to write driver 210-1 in the first column group accordingly. Similarly, the zeroth I/O circuit 126 would respond to its data in signal during a write operation to couple to write driver 210-2 in the zeroth column group in such a no-shift condition. Neither the first redundant column group nor the second redundant column group is used in that case.

Should the first and zeroth column groups be included in a one-shift region, the first I/O circuit 180 couples to write driver 210-2 in the zeroth column group during a write operation addressing the first column group. Similarly, the zeroth I/O circuit 126 couples to write driver 210-3 in the first redundant column group in such a one-shift condition during a write operation to the zeroth column group. Each I/O circuit includes a decoder that controls whether the I/O circuit shifts or not. Each decoder is shown separately in FIG. 2 from its I/O circuit for illustration purposes. For example, a decoder 220 controls the shifting of the first I/O circuit 180. Similarly, a decoder 225 controls the shifting of the zeroth I/O circuit 126.

Should the first and zeroth column groups be included in a two-shift region, a data in signal from the first I/O circuit 180 couples to write driver 210-3 in the first redundant column group during a write operation to the first column group. Similarly, a data in signal from the zeroth I/O circuit 126 couples to write driver 210-4 in the second redundant column group during a write operation to the zeroth column group. An example switch matrix for each I/O circuit will now be discussed.

Example Switch Matrix

Figure 3:
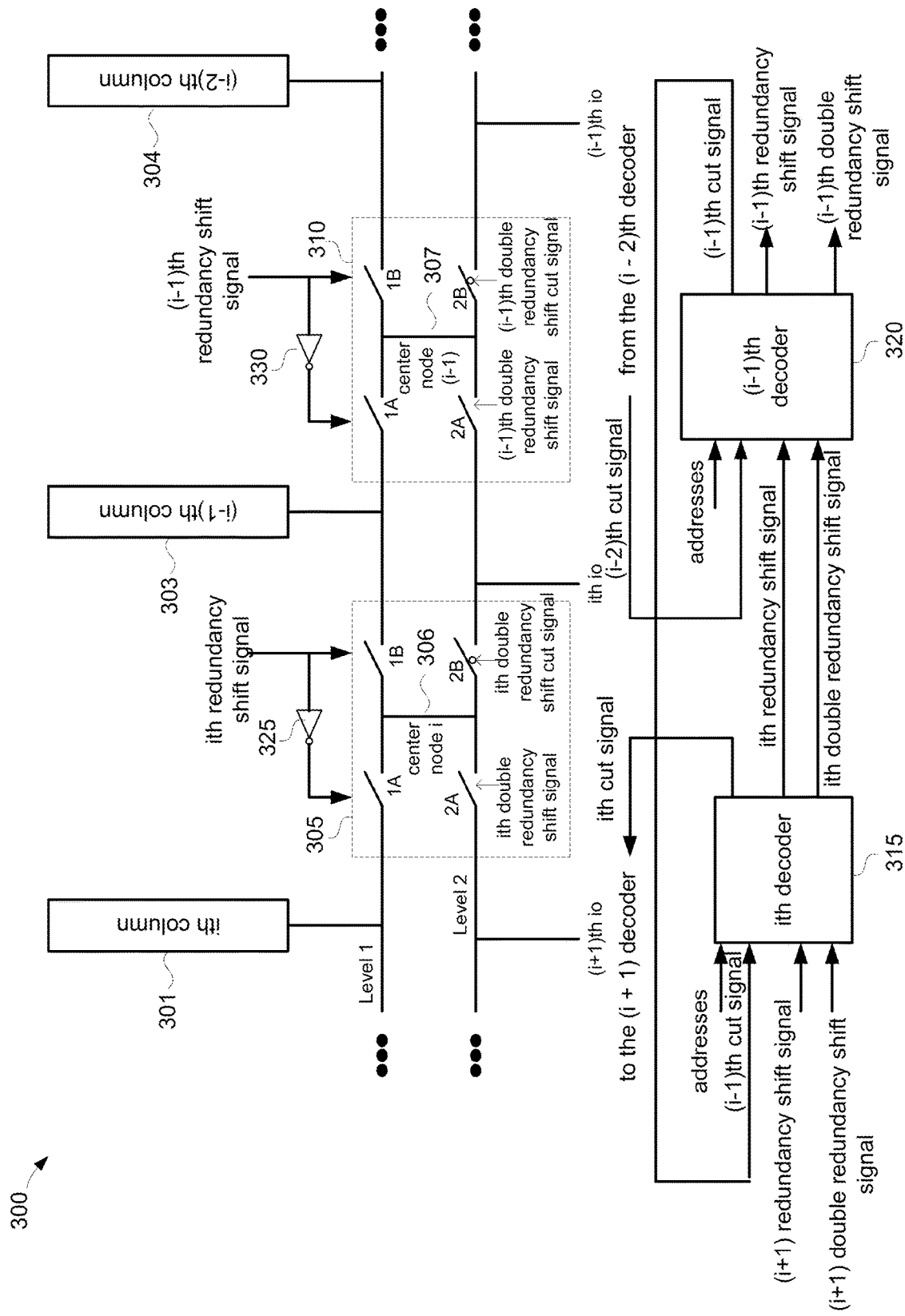
FIG. 3 illustrates a portion of a double redundancy shift memory bank including the switch matrices and the corresponding decoders in accordance with an aspect of the disclosure.

To perform the selection between a no shift, a single redundancy shift, and a double redundancy shift within each I/O circuit, each I/O circuit includes a switch matrix. As used herein, a "switch matrix" is deemed to include a plurality of switches. An example portion 300 of a memory bank is shown in FIG. 3, which includes an ith column group 301, an (i−1)th column group 303, and an (i−2)th column group 304, where i is a positive integer. In a default state (no column group errors and thus no shifting), an ith switch matrix 305 couples an ith I/O (io) signal to a core (not illustrated) in the ith column group 301. Similarly, an (i−1)th switch matrix 310 couples an (i−1)th io signal to the (i−1)th column group 303 in the absence of any errors. Each switch matrix is controlled by a corresponding decoder. For example, an ith decoder 315 controls the ith switch matrix 305. Similarly, an (i−1)th decoder 320 controls the (i−1)th switch matrix 310. Each decoder and switch matrix combination is part of a corresponding I/O circuit (not illustrated). An ith I/O circuit thus includes the ith switch matrix 305 and the ith decoder 315. Similarly, an (i−1)th I/O circuit includes the (i−1)th switch matrix 310 and the (i−1)th decoder 320.

Referring again to memory bank 100, it will be appreciated that redundancy shift signal 151 and double redundancy shift signal 152 are shown in simplified form in that each I/O circuit is controlled by an individual redundancy shift signal and an individual double redundancy shift signal. If there are N column groups (N being a plural positive integer), there are thus N redundancy shift signals and N double redundancy shift signals. In portion 300, an ith redundancy shift signal controls the switching of a switch 1B in ith switch matrix 305 whereas an ith double redundancy shift signal controls a switch 2A in the ith switch matrix 305. An (i−1)th redundancy shift signal controls the switching of an analogous switch 1B in the (i−1)th switch matrix 310 whereas an (i−1)th double redundancy shift signal controls a switch 2A in (i−1)th switch matrix 310.

Switch 1B in the ith switch matrix 305 couples to a switch 1A in (i−1)th switch matrix 310. Similarly, switch 1B in (i−1)th switch matrix 310 couples to a switch 1A in an (i−2)th switch matrix (not illustrated). The coupling between switch 1B and switch 1A in consecutive switch matrices may be deemed to a Level 1 coupling. In addition, a switch 2B in the ith switch matrix 305 couples to switch 2A in the (i−1)th switch matrix 310. Similarly, a switch 2B in the (i−1)th switch matrix 310 couples to a switch 2A in the (i−2)th switch matrix (not illustrated). The coupling between switch 2B and switch 2A in consecutive switch matrices may be deemed to be a Level 2 coupling. Each switch 2B is controlled by a double redundancy shift cut signal as will be described further herein. For example, an ith double redundancy shift cut signal controls switch 2B in the ith switch matrix 305. Similarly, an (i−1)th double redundancy shift cut signal controls switch 2B in the (i−1)th switch matrix 310.

In each switch matrix, switch 1B is configured to close when the corresponding redundancy shift signal is true. For example, switch 1B in the ith switch matrix 305 is configured to close when the ith redundancy shift signal is true. Conversely, each switch 1A is configured to close when the complement of the corresponding redundancy shift signal is true. For example, an inverter 325 inverts the ith redundancy shift signal to control the switching of switch 1A in the ith switch matrix 305. In the same fashion, an inverter 330 inverts the (i−1)th redundancy shift signal to control the switching of switch 1A in the (i−1)th switch matrix 310. Within each switch matrix, switches 1A, 1B, 2A, and 2B couple to each other through a center node. For example, a center node 306 in the ith switch matrix 305 couples its switches 1A, 1B, 2A, and 2B together. Similarly, a center node 307 in the (i−1)th switch matrix 310 couples its switches 1A, 1B, 2A, and 2B together.

In each switch matrix, switch 2A is configured to close when the corresponding double redundancy shift signal is true. For example, switch 2A in the (i−1)th switch matrix 310 closes when the (i−1)th double redundancy shift signal is true. Similarly, switch 2A in the ith switch matrix 305 closes when the ith double redundancy shift signal is true. Each switch 2B is configured to close when the complement of the corresponding double redundancy shift cut signal is true. For example, switch 2B in the ith switch matrix 305 closes when the ith double redundancy shift cut signal is false. Conversely, switch 2B in the ith switch matrix 305 opens when the ith double redundancy shift cut signal is true.

Each decoder is configured to generate a corresponding binary cut signal as will be explained further herein. To control the corresponding shift matrix, each decoder feeds forward its redundancy shift signal and its double redundancy shift signal to the decoder in the subsequent I/O circuit. For example, the ith decoder 315 feeds forward the ith redundancy shift signal and the ith double redundancy shift signal to the (i−1)th decoder 320. Similar, each decoder feeds back its cut signal to the decoder in the preceding I/O circuit. For example, the (i−1)th decoder 315 feeds back its (i−1)th cut signal to the ith decoder 315.

Each decoder may thus receive the cut signal from the subsequent I/O circuit's decoder and receive the redundancy shift signal and the double redundancy shift signal from the preceding I/O circuit's decoder. Based upon these signals and upon its own cut signal, the decoder then generates its redundancy shift signal, its double redundancy shift signal, and its double redundancy shift cut signal to control the corresponding switch matrix. For example, the ith decoder 315 receives an (i+1)th redundancy shift signal and an (i+1)th double redundancy shift signal from an (i+1)th I/O circuit's decoder (not illustrated). In addition, the ith decoder 315 receives the (i−1)th cut signal from the (i−1)th decoder 320. Based upon these signals and upon the ith cut signal, the ith decoder 315 may generate the ith redundancy shift signal, the ith double redundancy shift signal, and the ith double redundancy shift cut signal.

As will be explained further herein, each decoder may be configured with decoder logic to control the generation of its redundancy shift signal, its double redundancy shift signal, and its double redundancy shift cut signal. An example truth table 400 for the decoder logic in ith decoder 315 is shown in FIG. 4A. It will be appreciated that analogous logic applies for the remaining decoders such as for the (i−1)th decoder 320. Should the ith column group 301 be in the no-shift region 105 of memory bank 100, a no shift mode in truth table 400 is active. In this no shift mode, the ith cut signal, the (i+1)th redundancy shift signal, the (i+1)th double redundancy shift signal, and the (i−1)th cut signal are all false (having a binary zero state). The decoder logic then responds in this no shift mode to cause the ith redundancy shift signal, the ith double redundancy shift signal, and the ith double redundancy shift cut signal to all be false. In the no shift mode, switch 1a is on, switch 1b is off, switch 2a is off, and switch 2b is on. The ith io signal will thus propagate through switch matrix 305 to the ith column group 301.

Should the ith column group 301 instead be in the one-shift region 110, the single shift mode in truth table 400 is active. In the single shift mode, there are two possibilities that depend upon whether the ith column group 301 is the initial defective column group in the one-shift region 110 or whether the ith column group 301 is subsequent to the initial defective column group. An example of the initial defective column group is the 11$^{th}$ column group in memory bank 100. An example of a column group subsequent to this initial defective column group in one-shift region 110 in memory bank 100 would be the 10$^{th}$ column group or the 9$^{th}$ column group. In both of these possibilities, the decoder logic responds to set the ith redundancy shift signal to be true and to set the ith double redundancy shift signal and the ith double redundancy shift cut signal to both be false. The ith decoder 315 is then controlled so that its switch 1b is on, its switch 2a is off, and its switch 2b is on.

The single shift mode for the decoder logic in ith decoder 315 should the ith column group 301 be the initial defective column group in the one-shift region 110 is designated in truth table 400 as a "single shift (the ith column is the first defective column)" mode. In this mode, the ith cut signal is true whereas the (i+1)th redundancy shift signal, the (i+1)th double redundancy shift signal, and the (i−1)th cut signal are all false. A single shift mode for the decoder logic in ith decoder 315 should the ith column group 301 be subsequent to the initial defective column group in the one-shift region 110 is designated in truth table 400 as a "single shift (the ith column is the subsequent to the first defective column)" mode. In this mode, the (i+1)th redundancy shift signal is true whereas the ith cut signal, the (i+1)th double redundancy shift signal, and the (i−1)th cut signal are all false. In both of these one-shift modes, the ith io signal propagates through the ith switch matrix 305 to couple to the (i−1)th column group 303.

Should the ith column group 301 instead be in the two-shift region 115, the double shift mode in truth table 400 is active. In the double shift mode, there are three possibilities that depend upon the location of the ith column group 301 in two-shift region 115. In a first possibility, the ith column group 301 is the second defective column group. An example of the second defective column group is the 7$^{th}$ column group in memory bank 100. The corresponding mode in truth table 400 is designated as the "double shift (the ith column is the second defective column)" mode. In this mode, the ith cut signal and the (i+1)th redundancy shift signal are both true whereas the (i+1)th double redundancy shift signal and the (i−1)th cut signal are both false. The decoder logic responds to these signal states by setting the ith redundancy shift signal, the ith double redundancy shift signal, and the ith double redundancy shift cut signal to all be true. Switch 1a is then off, switch 1b is on, switch 2a is on, and switch 2b is off.

In the second possibility for the double shift mode, the ith column group 301 is a subsequent column group to the second defective column group. An example of such a column group in memory bank 100 would be any one of the 6$^{th}$ column group through the 0$^{th}$ column group. The corresponding mode in truth table 400 is designated as the "double shift (the ith column is subsequent to the 2$^{nd}$ defective column)" mode. In this mode, the (i+1)th redundancy shift signal and the (i+1)th double redundancy shift signal are both true whereas the ith cut signal and the (i−1)th cut signal are both false. The decoder logic responds to these signal states by setting the ith redundancy shift signal, the ith double redundancy shift signal, and the ith double redundancy shift cut signal to all be true. Switch 1a is then off, switch 1b is on, switch 2a is on, and switch 2b is off.

In the third possibility for the double shift mode, the ith column group 301 is the preceding column group to the second defective column group. An example of such a column group in memory bank 100 would be the 8$^{th}$ column group. The corresponding mode in truth table 400 is designated as the "double shift (the ith column precedes the 2$^{nd}$ defective column)" mode. In this mode, the (i+1)th redundancy shift signal and the (i−1)th cut signal are both true whereas the ith cut signal and the (i+1) redundancy shift signal are all false. The decoder logic responds to these signal states by setting the ith redundancy shift signal and the ith double redundancy shift cut signal to be true and by setting the ith double redundancy shift signal to be false. Switch 1a is then off, switch 1b is on, switch 2a is off, and switch 2b is off.

Figure 4B:
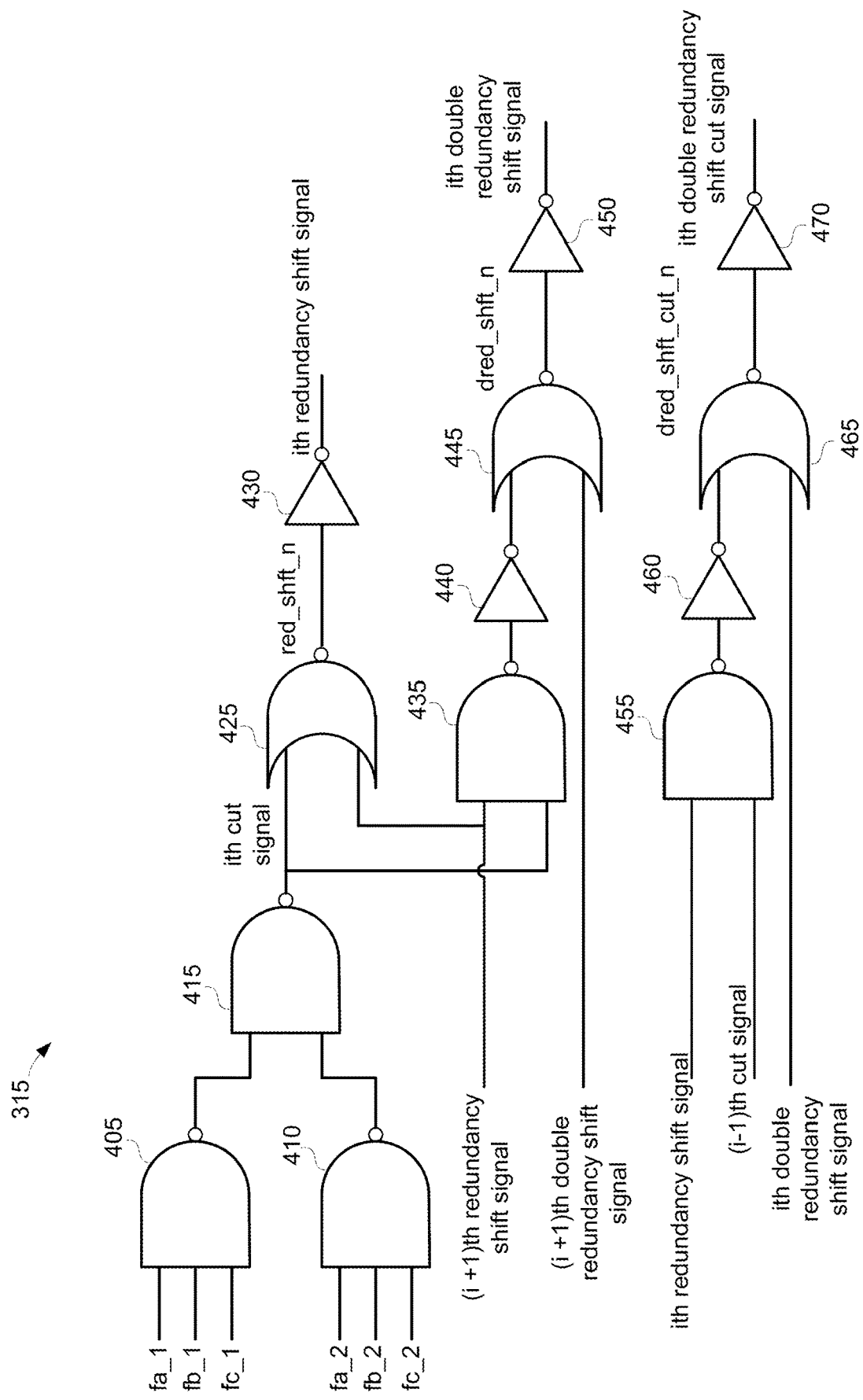
FIG. 4B is a circuit diagram of a decoder for a double redundancy shift memory bank in accordance with an aspect of the disclosure.

Truth table 400 may be implemented using a variety of logic gates. An example logic gate implementation for the ith decoder 315 is shown in FIG. 4B. One function of ith decoder 315 is to determine whether the ith column group 301 is an initial defective column group or a second defective column group in the corresponding memory bank. As noted earlier, a test of a memory bank may be performed at manufacture to identify the addresses of the initial defective column group (if present) and of the second defective column group (if present). There is thus a set of pre-decoded address signals fa-1, fb-1, and fc-1 that identify the first defective column group. These pre-decoded address signals are true only for the redundancy decoder corresponding to the first defective column group. But at least one of them is false for all remaining redundancy decoders. Similarly, there is a set of pre-decoded address signals fa-2, fb-2, and fc-2 that identify the second defective column group. These pre-decoded address signals are true only for the redundancy decoder corresponding to the second defective column group. But at least one of them is false for all remaining redundancy decoders. Each decoder is configured to assert its cut signal only if the set of pre-decoded address signals fa-1, fb-1, and fc-1 or the set of pre-decoded address signals fa-1, fb-2, and fc-2 for the decoder's default column group are true. For example, if the ith column group 301 is faulty, then the ith decoder 315 asserts the ith cut signal.

In ith decoder 315, a first NAND gate 405 functions to decode the pre-decoded address signals fa-1, fb-1, and fc-1. An output signal of first NAND gate 405 will be false only if the ith column group is the first defective column group and will be true otherwise. Similarly, a second NAND gate 410 functions to decode the pre-decoded address signals fa-2, fb-2, and fc-2. An output signal of second NAND gate 410 will be false only if the ith column group is the second defective column group and will be true otherwise.

A logic gate such as a NAND gate 415 NANDs the output signals from NAND gates 405 and 410 to produce the ith cut signal. It can be shown that a combination of a NOR gate 425 that NORs the ith cut signal with the (i+1)th redundancy shift signal to produce an output signal red_shft_n that is inverted by an inverter 430 to produce the ith redundancy shift signal will control the binary states of the ith redundancy shift as discussed with regard to truth table 400.

It can be further shown that a combination of a NAND gate 435, an inverter 440, a NOR gate 445, and an inverter 450 controls the binary states of the ith double redundancy shift signal as discussed with regard to truth table 400. NAND gate 435 NANDs the ith cut signal with the (i+1) redundancy shift signal to produce an output signal that is inverted by inverter 440. NOR gate 445 NORs an output signal from inverter 440 with the (i+1) double redundancy shift signal to produce an output signal dred_shft_n that is inverted by inverter 450 to produce the ith double redundancy shift signal.

In addition, it can be shown that a combination of a NAND gate 455, an inverter 460, a NOR gate 465, and an inverter 470 controls the binary states of the ith double redundancy shift cut signal as discussed with regard to truth table 400. NAND gate 455 NANDs the ith redundancy shift signal with the (i−1) cut signal to produce an output signal that is inverted by inverter 460. NOR gate 465 NORs an output signal of inverter 460 with the ith double redundancy shift signal to produce an output signal dred_shft_cut_n that is inverted by inverter 470 to produce the ith double redundancy shift cut signal.

Note that the single and double column group shifting by the switch matrices disclosed herein does not affect the column multiplexing in the local data paths. In other words, the column redundancy disclosed herein is independent of the column multiplexing, i.e., whether the column multiplexing is MUX2, MUX4, and so on. The column redundancy disclosed herein may thus be readily implemented in any suitable memory bank, regardless of the column multiplexing magnitude.

Some example implementations of the switch matrices will now be discussed.

Write Path Switch Matrices

Figure 5:
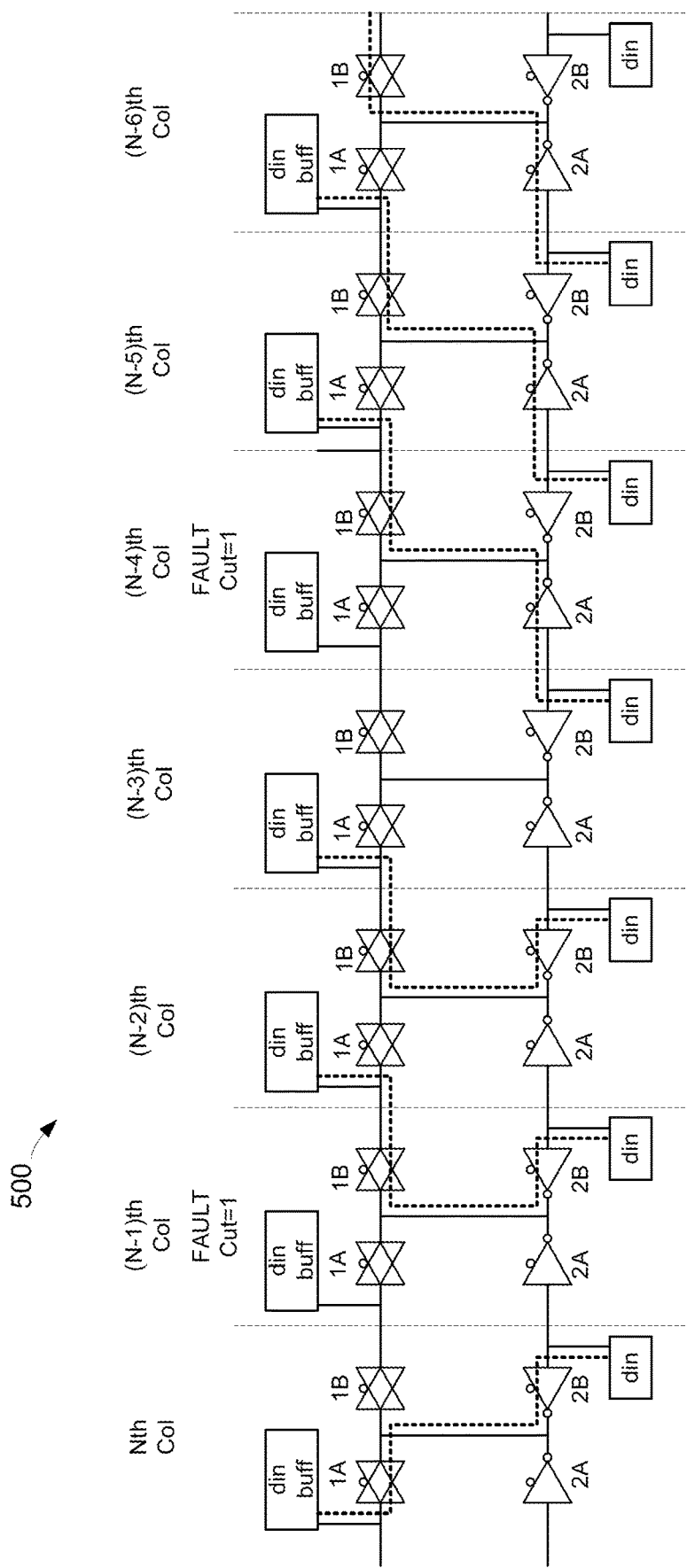
FIG. 5 illustrates a write path portion of a double redundancy shift memory bank in accordance with an aspect of the disclosure.

Referring again to memory bank portion 300, it will be appreciated that the switch matrices are shown in simplified form as there may be a write switch matrix for the write path and also a separate read switch matrix for the read path. A portion 500 of a memory bank is shown in FIG. 5 that illustrates some example write path switch matrices. Portion 500 includes seven switch matrices for seven column groups, starting with an Nth column group through an (N−6)th column group (N being a positive integer greater than six). In this example implementation, each switch 1A and switch 1B is formed by a transmission gate although other types of switches may be used. Each switch matrix thus includes a transmission gate 1A and a transmission gate 1B. Each switch 2A and 2B is formed by a tri-state inverter although other types of switches may be used. Each switch matrix thus includes a tri-state inverter 2A and a tri-state inverter 2B. The tri-state control signals for the 2A and 2B tri-state inverters are not shown for illustration clarity. The (N−1)th column group is the first initial defective column. The Nth column is thus still in the default no-shift state. The data input signal for each column group is stored in a corresponding data in (din) latch. The term "latch" is used herein to refer generically to a storage element that may store a binary signal.

Since the Nth column group is in a no-shift state, its tri-state inverter 2B and transmission gate 1A are conducting. A data in signal for the Nth column group will thus conduct from its din latch to a data in (din) buffer for the Nth column group. With the (N−1)th column group being the first defective column group, each transmission gate 1A will be non-conducting beginning with the (N−1)th column group and continuing through the (N−6)th column group. Similarly, each transmission gate 1B will be conducting beginning with the (N−1)th column group and continuing through the (N−6)th column group.

The second defective column group is the (N−4)th column group. The cut signal for each of the defective column groups will be true whereas the cut signal for each of the remaining column groups will be false. Since the defective column groups are the (N−1)th column group and the (N−4)th column group, those column groups are the only column groups for which the cut signal is true. With the (N−4)th column group being the second defective column group, only the (N−1)th column group and the (N−2)th column group are in a one-shift region. Tri-state inverter 2B and transmission gate 1B are thus conducting in the switch matrices for these column groups as discussed analogously for portion 300. The (N−3)th column group through the (N−6)th column group are in a two-shift region. Since the (N−3)th column group is the initial column group in the two-shift region, the transmission gate 1A and tri-state inverters 2A and 2B in the corresponding switch matrix are non-conducting. Beginning with the second defective column group (in this example, the (N−4)th column group), each transmission gate 1B and tri-state inverter 2A is conducting to provide the desired double redundancy shift. Due to the inversion of the data input signal in the tri-state inverters 2A or 2B, each din buffer may be configured to invert its buffered data input signal. Some example read path switch matrices will now be discussed.

Read Path Switch Matrices

Figure 6:
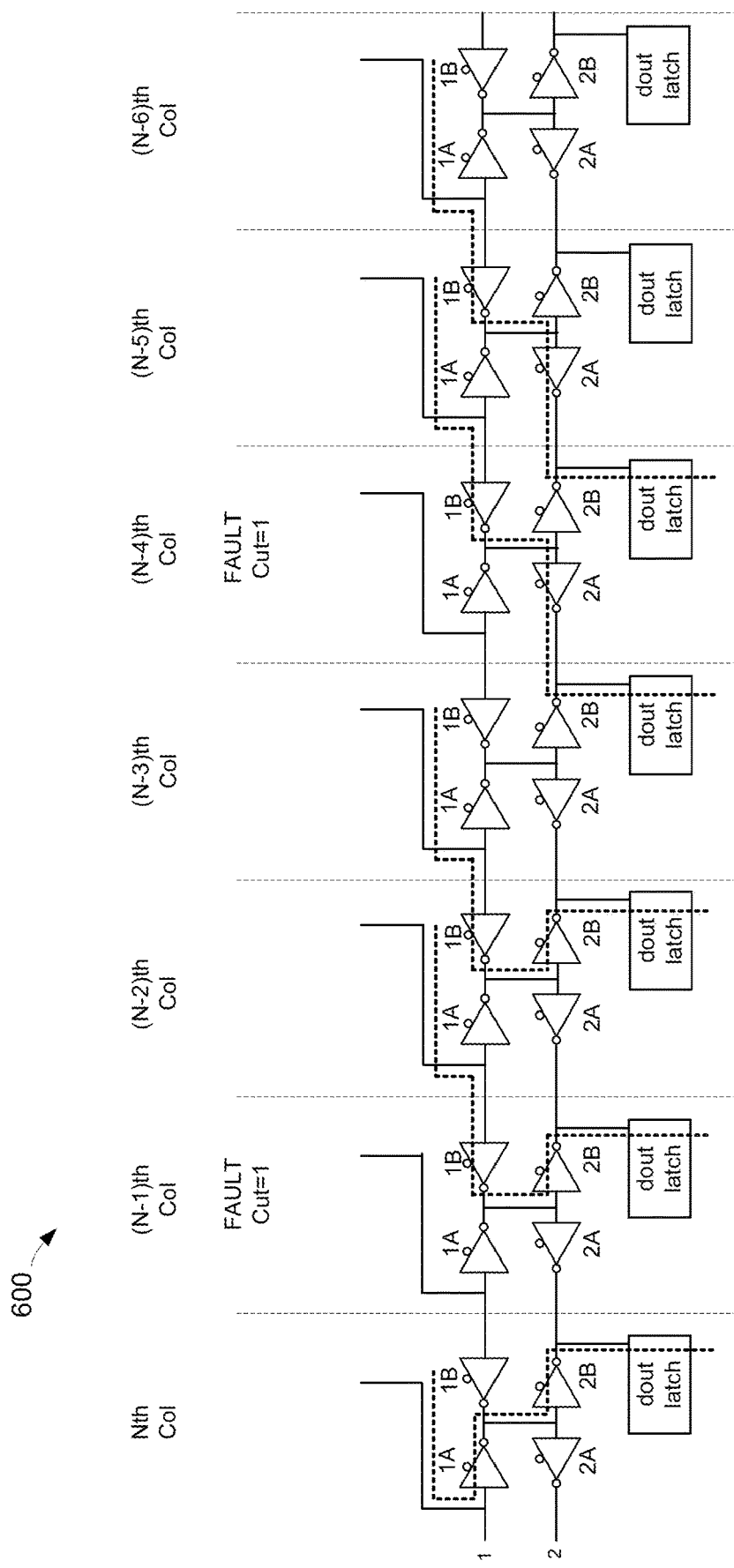
FIG. 6 illustrates a read path portion of a double redundancy shift memory bank in accordance with an aspect of the disclosure.

A portion 600 of a memory bank is shown in FIG. 6 that illustrates some example read path switch matrices. Portion 600 is analogous to portion 500 and thus includes seven switch matrices for seven column groups, starting with an Nth column group through an (N−6)th column group (N being a positive integer greater than six). In this example implementation, each switch 1A and switch 1B is formed by a tri-state inverter although other types of switches may be used. Each switch matrix thus includes a tri-state inverter 1A and a tri-state inverter 1B. Each switch 2A and 2B is also formed by a tri-state inverter although other types of switches may be used. Each switch matrix thus includes a tri-state inverter 2A and a tri-state inverter 2B. The tri-state control signals for the 1A, 1B, 2A, and 2B tri-state inverters are not shown for illustration clarity. The (N−1)th column group is the first initial defective column group. The Nth column group is thus still in the default no-shift state. The read path for these column groups may select between a first bank's column group or a second bank's column group in some implementations (the banks are not shown for illustration clarity).

Since the Nth column group is in a no-shift state, the tri-state inverter 2B and tri-state inverter 1A in the corresponding switch matrix are conducting. A data output signal for the Nth column group will thus conduct from the selected bank to a data out (dout) latch for the Nth column group. With the (N−1)th column group being the first defective column group, each tri-state inverter 1A will be non-conducting beginning with the switch matrix for the (N−1)th column group and continuing through the switch matrix for the (N−6)th column group. Similarly, each tri-state inverter 1B will be conducting beginning with the switch matrix for the (N−1)th column group and continuing through the switch matrix for the (N−6)th column group.

The second defective column group is the (N−4)th column group. The cut signal for each of the defective column groups will be true whereas the cut signal for each of the remaining column groups will be false. Since the defective column groups are the (N−1)th column group and the (N−4)th column group, those column groups are the only column groups for which the cut signal is true. With the (N−4)th column group being the second defective column group, only the (N−1)th column group and the (N−2)th column group are one-shift columns. The tri-state inverter 2B and tri-state inverter 1B in the corresponding switch matrices are thus conducting for such a one-shift state as discussed analogously for portion 300. The (N−3)th column group through the (N−6)th column group are two-shift column groups. Since the (N−3)th column group is the initial two-shift column group, the tri-state inverter 1A and tri-state inverters 2A and 2B in the corresponding switch matrix are non-conducting. Beginning with the second defective column group (in this example, the (N−4)th column group), each tri-state inverter 1B and tri-state inverter 2A is conducting in the corresponding switch matrices to provide the desired double redundancy shift.

Figure 7:
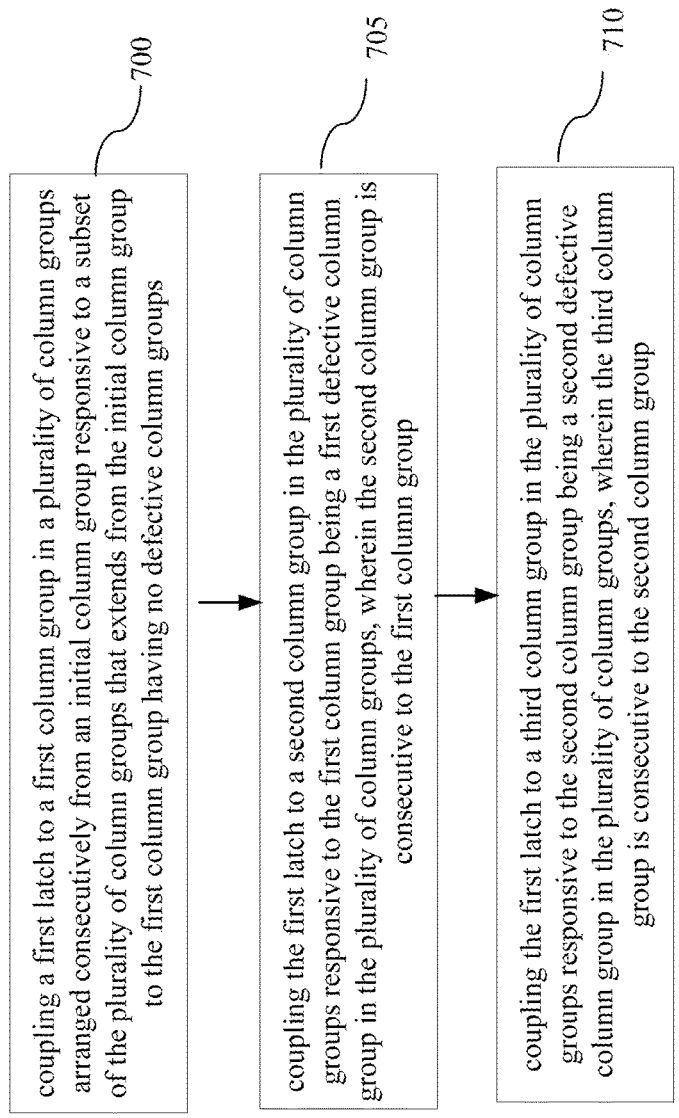
FIG. 7 is a flowchart of a double redundancy shift method for a memory bank in accordance with an aspect of the disclosure.

A double redundancy shift method of operation for a memory will now be discussed with regard to the flowchart of FIG. 7. The method includes an act 700 of coupling a first latch to a first column group in a plurality of column groups arranged consecutively from an initial column group responsive to a subset of the plurality of column groups that extends from the initial column group to the first column group having no defective column groups. Referring to FIG. 5, the coupling of the Nth data input latch to the Nth column group is an example of act 700. Similarly, the coupling of the Nth data output latch to the Nth column group as shown in FIG. 6 is another example of act 700. The method also includes an act 705 of coupling the first latch to a second column group in the plurality of column groups responsive to the first column group being a first defective column group in the plurality of column groups, wherein the second column group is consecutive to the first column group. The coupling of the (N−1)th data input latch to the (N−2)th column group as shown in FIG. 5 is an example of act 705. Similarly, the coupling of the (N−1) data output latch to the (N−2)th column group as shown in FIG. 6 is an example of act 705. Finally, the method includes an act 710 of coupling the first latch to a third column group in the plurality of column groups responsive to the second column group being a second defective column group in the plurality of column groups, wherein the third column group is consecutive to the second column group. The coupling of the (N−4)th data input latch to the (N−6)th column group as shown in FIG. 5 is an example of act 710. Similarly, the coupling of the (N−4)th data output latch to the (N−6)th column group as shown in FIG. 6 is an example of act 710.

Figure 8:
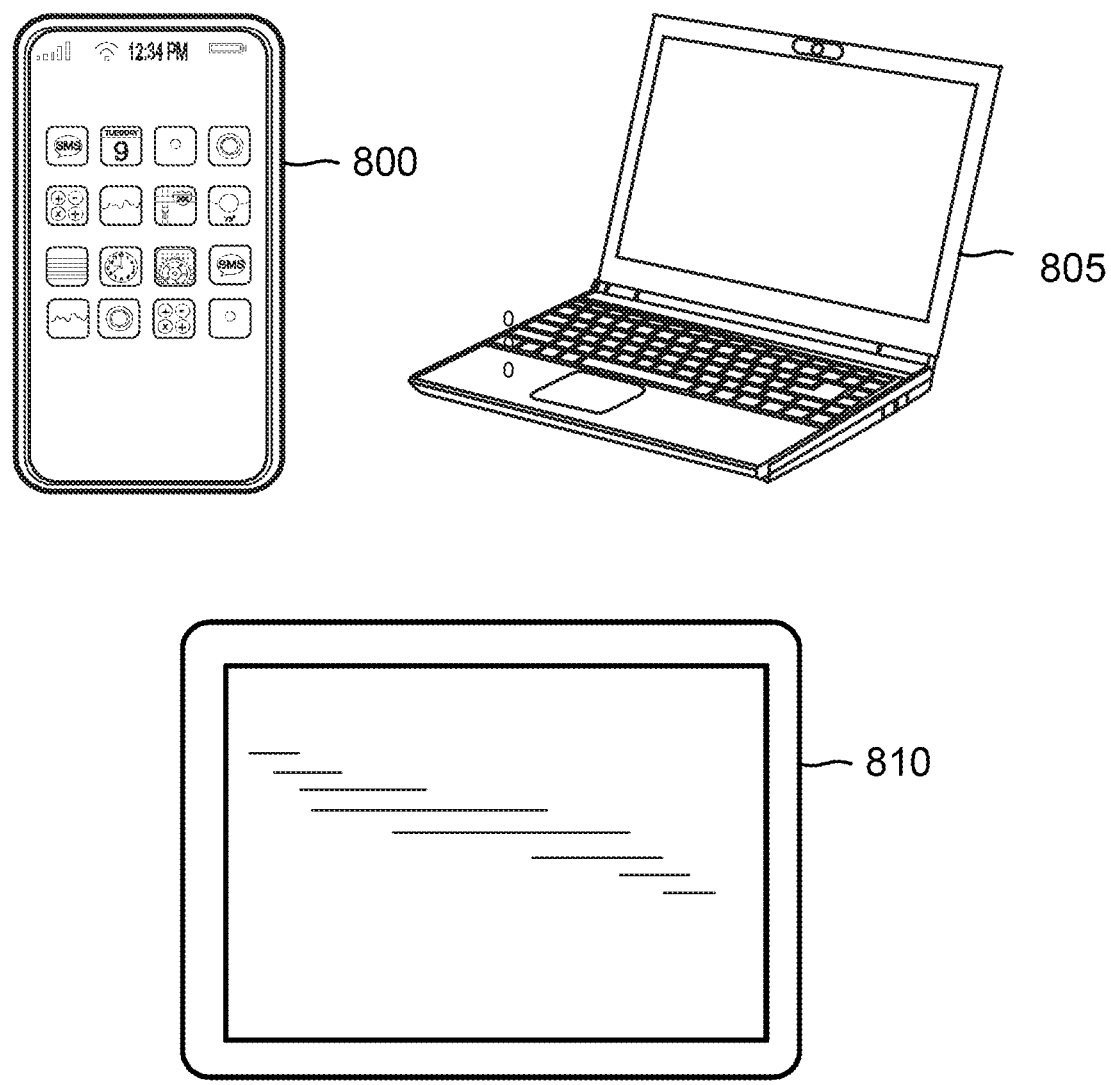
FIG. 8 illustrates some example electronic systems incorporating a double redundancy shift memory in accordance with an aspect of the disclosure.

A memory as disclosed herein may be incorporated into a wide variety of electronic systems. For example, as shown in FIG. 8, a cell phone 800, a laptop 805, and a tablet PC 810 may all include a memory having a double redundancy shift in accordance with the disclosure. Other exemplary electronic systems such as a music player, a video player, a communication device, and a personal computer may also be configured with memories constructed in accordance with the disclosure.

The disclosure will now be summarized by the following example clauses:

Clause 1. A memory, comprising:
  a plurality of column groups, each column group in the plurality of column groups including a plurality of multiplexed columns, the plurality of column groups including a first column group, a second column group that is adjacent to the first column group, and a third column group that is adjacent to the second column group; and
  a first switch matrix configured to couple a latch to one of the first column group, the second column group, and the third column group responsive to a plurality of column redundancy signals.

Clause 2. The memory of clause 1, wherein the first switch matrix comprises:
  a first center node;
  a first switch coupled between the first column group and the first center node; and
  a second switch coupled between the first center node and the latch, the memory further comprising:
  a first decoder configured to close the first switch and to close the second switch to couple the latch to the first column group responsive to the plurality of column groups having no defective column group from an initial column group in the plurality of column groups to the first column group.

Clause 3. The memory of clause 2, wherein the first switch matrix further comprises:

a third switch coupled between the first center node and the second column group, wherein the first decoder is further configured to open the first switch, close the second switch, and close the third switch to couple the latch to the second column group responsive to the first column group being an initial defective column group in the plurality of column groups.

Clause 4. The memory of clause 2, wherein the first decoder is further configured to open the second switch responsive to the second column group being a second defective column group in the plurality of column groups, the memory further comprising:
- a second switch matrix including a third switch coupled between the latch and a second center node and including a fourth switch coupled between the second center node and the third column group; and
- a second decoder configured to close the third switch and to close the fourth switch to couple the latch to the third column group responsive to the second column group being the second defective column group.

Clause 5. The memory of any of clauses 1-4, wherein the memory further comprises:
- a first redundant column group; and
- a second redundant column group.

Clause 6. The memory of any of clauses 2-4, wherein the first switch comprises a transmission gate and the second switch comprises a tri-state inverter.

Clause 7. A memory, comprising:
- a plurality of columns groups, each column group in the plurality of column groups including a plurality of multiplexed columns, the plurality of column groups including a first column group and a second column group adjacent to the first column group;
- a first latch;
- a second latch; and
- a first switch matrix including: a first switch coupled between the first column group and a first center node, a second switch coupled between the first center node and the second column group, a third switch coupled between the first latch and the first center node, and a fourth switch coupled between the first center node and the second latch.

Clause 8. The memory of clause 7, wherein the first switch matrix comprises:
- a third latch;
- a first redundant column group adjacent to the second column group;
- a second redundant column group adjacent to the first redundant column group; and
- a second switch matrix including: a first switch coupled between the second column group and a second center node, a second switch coupled between the second center node and the first redundant column group, a third switch coupled between the second latch and the second center node, and a fourth switch coupled between the second center node and the third latch.

Clause 9. The memory of any of clauses 7-8, a first decoder configured to control the first switch matrix responsive to whether the first column group is in a no-shift region of the plurality of column groups, a one-shift region of the plurality of column groups, or a two-shift region of the plurality of column groups.

Clause 10. The memory of clause 9, wherein the first decoder is further configured to decode an address of the first column group to determine whether the first column group is in the no-shift region, the one-shift region, or the two-shift region.

Clause 11. The memory of any of clauses 1-10, wherein the memory is integrated into a cellular telephone.

Clause 12. The memory of any of clauses 1-10, wherein the memory is a static random-access memory (SRAM).

Clause 13. The memory of any of clauses 7-12, wherein the first column group comprises a first plurality of bit line pairs and the second column group comprises a second plurality of bit line pairs.

Clause 14. A memory, comprising:
- a plurality of column groups, each column group in the plurality of column groups including a plurality of multiplexed columns, the plurality of column groups including a first column group and a second column group; a first latch; a second latch; a first switch matrix coupled to the first column group, the second column group, the first latch, and the second latch; a first redundant column group including a first plurality of multiplexed redundant columns; and a second redundant column group including a second plurality of multiplexed redundant columns.

Clause 15. The memory of clause 14, further comprising:
- a first decoder configured to decode an address signal to control a switching state of the first switch matrix responsive to a column redundancy state of the plurality of column groups.

Clause 16. The memory of clause 15, wherein the first switch matrix comprises:
- a first switch coupled between the first column group and a first center node, a second switch coupled between the first center node and the second column group, a third switch coupled between the first latch and the first center node, and a fourth switch coupled between the first center node and the second latch.

Clause 17. The memory of any of clauses 14-16, wherein each plurality of multiplexed columns comprises a plurality of multiplexed bit line pairs.

Clause 18. The memory of any of clauses 15-16, wherein the first decoder includes a first logic gate configured to decode a first address signal.

Clause 19. The memory of clause 18, wherein the first decoder further includes a second logic gate configured to decode a second address signal.

Clause 20. The memory of clause 19, wherein the first logic gate and the second logic gate each comprises a NAND gate.

Clause 21. The memory of any of clauses 14-20, wherein the first latch and the second latch each comprises an input latch for a write bit.

Clause 22. A method of column redundancy, comprising:
- coupling a first latch to a first column group in a plurality of column groups arranged consecutively from an initial column group responsive to a subset of the plurality of column groups that extends from the initial column group to the first column group having no defective column groups;
- coupling the first latch to a second column group in the plurality of column groups responsive to the first column group being a first defective column group in the plurality of column groups, wherein the second column group is consecutive to the first column group; and
- coupling the first latch to a third column group in the plurality of column groups responsive to the second column group being a second defective column group in the plurality of column groups, wherein the third column group is consecutive to the second column group.

Clause 23. The method of clause 22, further comprising: decoding a first address to determine whether the first column group is the first defective column group in the plurality of column groups.

Clause 24. The method of clause 23, further comprising: decoding a second address to determine whether the first column group is the second defective column group in the plurality of column groups.

Clause 25. The method of clause 24, wherein decoding the first address comprises decoding the first address in a first logic gate and decoding the second address comprises decoding the second address in a second logic gate.

Clause 26. The method of any of clauses 22-27, further comprising:
coupling a final latch to a final column group in the plurality of column groups responsive to the plurality of column groups having no defective column groups.

Clause 27. The method of clause 28, further comprising:
coupling the final latch to a first redundant column group responsive to the plurality of column groups including the first defective column group and not including the second defective column group.

Clause 28. The method of clause 26, further comprising:
coupling the final latch to a second redundant column group responsive to the plurality of column groups including the first defective column group and the second defective column group.

Clause 29. The method of clause 28, wherein coupling the final latch to the second redundant column group comprises coupling a final input latch to the second redundant column group.

Clause 30. The method of clause 28, wherein coupling the final latch to the second redundant column group comprises coupling a final output latch to the second redundant column group.

As those of some skill in this art will by now appreciate and depending on the particular application at hand, many modifications, substitutions and variations can be made in and to the materials, apparatus, configurations and methods of use of the devices of the present disclosure without departing from the scope thereof. In light of this, the scope of the present disclosure should not be limited to that of the particular implementations illustrated and described herein, as they are merely by way of some examples thereof, but rather, should be fully commensurate with that of the claims appended hereafter and their functional equivalents.

What is claimed is:

1. A memory, comprising:
a plurality of column groups, each column group in the plurality of column groups including a plurality of multiplexed columns, the plurality of column groups including a first column group, a second column group that is adjacent to the first column group, and a third column group that is adjacent to the second column group; and
a first switch matrix configured to couple a latch to one of the first column group, the second column group, and the third column group responsive to a plurality of column redundancy signals.

2. The memory of claim 1, wherein the first switch matrix comprises:
a first center node;
a first switch coupled between the first column group and the first center node; and
a second switch coupled between the first center node and the latch, the memory further comprising:
a first decoder configured to close the first switch and to close the second switch to couple the latch to the first column group responsive to the plurality of column groups having no defective column group from an initial column group in the plurality of column groups to the first column group.

3. The memory of claim 2, wherein the first switch matrix further comprises:
a third switch coupled between the first center node and the second column group, wherein the first decoder is further configured to open the first switch, close the second switch, and close the third switch to couple the latch to the second column group responsive to the first column group being an initial defective column group in the plurality of column groups.

4. The memory of claim 2, wherein the first decoder is further configured to open the second switch responsive to the second column group being a second defective column group in the plurality of column groups, the memory further comprising:
a second switch matrix including a third switch coupled between the latch and a second center node and including a fourth switch coupled between the second center node and the third column group; and
a second decoder configured to close the third switch and to close the fourth switch to couple the latch to the third column group responsive to the second column group being the second defective column group.

5. The memory of claim 1, wherein the memory further comprises:
a first redundant column group; and
a second redundant column group.

6. The memory of claim 2, wherein the first switch comprises a transmission gate and the second switch comprises a tri-state inverter.

7. A method of column redundancy, comprising:
coupling a first latch to a first column group in a plurality of column groups responsive to a subset of the plurality of column groups that extends from an initial column group to the first column group having no defective column groups;
coupling the first latch to a second column group in the plurality of column groups responsive to the first column group being a first defective column group in the plurality of column groups, wherein the second column group is adjacent to the first column group; and
coupling the first latch to a third column group in the plurality of column groups responsive to the second column group being a second defective column group in the plurality of column groups, wherein the third column group is adjacent to the second column group.

8. The method of claim 7, further comprising:
decoding a first address to determine whether the first column group is the first defective column group in the plurality of column groups.

9. The method of claim 8, further comprising:
decoding a second address to determine whether the first column group is the second defective column group in the plurality of column groups.

10. The method of claim 9, wherein decoding the first address comprises decoding the first address in a first logic gate and decoding the second address comprises decoding the second address in a second logic gate.

11. The method of claim 9, further comprising:
coupling a final latch to a final column group in the plurality of column groups responsive to the plurality of column groups having no defective column groups.

12. The method of claim 11, further comprising:
coupling the final latch to a first redundant column group responsive to the plurality of column groups including the first defective column group and not including the second defective column group.

13. The method of claim 11, further comprising:
coupling the final latch to a second redundant column group responsive to the plurality of column groups including the first defective column group and the second defective column group.

14. The method of claim 13, wherein coupling the final latch to the second redundant column group comprises coupling a final input latch to the second redundant column group.

15. The method of claim 13, wherein coupling the final latch to the second redundant column group comprises coupling a final output latch to the second redundant column group.

\* \* \* \* \*